(12) United States Patent
Kakizawa et al.

(10) Patent No.: US 7,375,066 B2
(45) Date of Patent: May 20, 2008

(54) SEMICONDUCTOR WAFER CLEANING AGENT AND CLEANING METHOD

(75) Inventors: Masahiko Kakizawa, Saitama (JP); Mayumi Kimura, Saitama (JP); Hironori Mizuta, Saitama (JP); Ichiro Hayashida, Saitama (JP)

(73) Assignee: Wako Pure Chemical Industries, Ltd., Osaka (JP)

( * ) Notice: Subject to any disclaimer, the term of this patent is extended or adjusted under 35 U.S.C. 154(b) by 0 days.

(21) Appl. No.: 10/203,659

(22) PCT Filed: Mar. 19, 2001

(86) PCT No.: PCT/JP01/02148

§ 371 (c)(1),
(2), (4) Date: Aug. 27, 2002

(87) PCT Pub. No.: WO01/71789

PCT Pub. Date: Sep. 27, 2001

(65) Prior Publication Data

US 2003/0083214 A1 May 1, 2003

(30) Foreign Application Priority Data

Mar. 21, 2000 (JP) ............................. 2000-078385

(51) Int. Cl.
*C11D 1/00* (2006.01)
(52) U.S. Cl. .................. 510/175; 252/390; 134/1.3
(58) Field of Classification Search ................ 510/176, 510/175, 212, 202, 499; 134/2, 3, 38; 430/331
See application file for complete search history.

(56) References Cited

U.S. PATENT DOCUMENTS

| | | | | |
|---|---|---|---|---|
| 5,019,296 A | * | 5/1991 | Baur et al. .................. 510/480 |
| 5,561,105 A | * | 10/1996 | Honda ........................ 510/178 |
| 5,795,828 A | * | 8/1998 | Endo et al. ................. 438/678 |
| 5,885,362 A | * | 3/1999 | Morinaga et al. .............. 134/2 |
| 6,068,000 A | | 5/2000 | Tanabe et al. |
| 6,080,709 A | | 6/2000 | Ishikawa et al. |
| 6,143,705 A | | 11/2000 | Kakizawa et al. |
| 6,261,953 B1 | * | 7/2001 | Uozumi ...................... 438/687 |
| 6,773,873 B2 | * | 8/2004 | Seijo et al. ................. 430/329 |
| 6,896,744 B2 | * | 5/2005 | Morinaga et al. ............. 134/28 |
| 2001/0011515 A1 | * | 8/2001 | Aoki et al. .............. 106/14.42 |
| 2001/0030315 A1 | * | 10/2001 | Aoki et al. ................. 252/390 |
| 2002/0045556 A1 | * | 4/2002 | Morinaga et al. ........... 510/175 |
| 2003/0024431 A1 | * | 2/2003 | Inoue et al. ............... 106/1.23 |
| 2003/0136055 A1 | * | 7/2003 | Li et al. ....................... 51/298 |

FOREIGN PATENT DOCUMENTS

EP 0 993 031 A2 4/2000
JP 11-40526 2/1999

\* cited by examiner

*Primary Examiner*—Gregory Webb
(74) *Attorney, Agent, or Firm*—Westerman, Hattori, Daniels & Adrian, LLP.

(57) ABSTRACT

A semiconductor surface cleaning agent containing a compound the molecule of which has a nitrogen atom having an unshared electron pair and used for cleaning the surface of a semiconductor on which copper wiring is provided, and a method for cleaning the surface of a semiconductor characterized by treating the surface of a semiconductor on which copper wiring is provided with such a cleaning agent. The cleaning agent does not corrode the copper wiring (copper thin film) on the semiconductor and $SiO_2$ of the interlayer insulating film, does not impair the flatness of the surface, and is effective in removing CuO and particles adhering to the surface of the Cu-CMP step.

31 Claims, No Drawings

SEMICONDUCTOR WAFER CLEANING AGENT AND CLEANING METHOD

FIELD OF THE INVENTION

The present invention relates to a cleaning agent and a method for cleaning the surface of a semiconductor on which copper wiring is provided.

BACKGROUND ART

A structure of LSI has been recently getting finer along with larger scale integration and has become a multilayer structure where metal wirings are stacked in several layers on the surface of a semiconductor. And also, copper (Cu) which has lower electric resistance has been proposed to be used for the metal wiring, replacing conventional aluminum.

A process to form a multilayer structure using Cu wiring comprises forming grooves on an insulating film such as silicon oxide, then depositing metal copper on the whole surface of a semiconductor by a method such as plating and sputtering, subsequently polishing excess metal Cu by means of so-called chemical mechanical polishing technology (CMP), which is a technique to flatten a semiconductor substrate surface by mechanical polishing while oxidizing metal Cu with supply of slurry, which is dispersion of fine particles of metal oxide such as alumina and silica in aqueous solution, and oxidizing agent at the same time on a wafer surface, forming Cu wiring by planarization of the surface with Cu remained only in the grooves to complete wiring (Cu-CMP step), and repeating said process with planarization of each layer.

On the other hand, since the surface of a semiconductor after the Cu-CMP step is contaminated with impurities such as iron oxide and copper oxide (CuO) coming from Cu used for the wiring by oxidation, which may affect electrical properties of a semiconductor and destroy a device, and also particles derived from the slurry used, it is required to remove these impurities by cleaning without impairing metal Cu of wiring exposed on the same plane as the surface of a semiconductor after the Cu-CMP step, and silicon dioxide ($SiO_2$) of interlayer dielectrics by introducing a cleaning step (post Cu-CMP cleaning) after the Cu-CMP step.

This post Cu-CMP cleaning is conventionally performed by chemical cleaning using an acidic cleaning agent such as HPM (hydrochloric acid-hydrogen peroxide type), DHF (diluted hydrofluoric acid type), a neutral cleaning agent such as buffered hydrofluoric acid, an alkaline cleaning agent such as APM (ammonia-hydrogen peroxide type), an organic acid type cleaning agent represented by citric acid, or the like, or physical cleaning using, for example, high-speed rotation brush made of polyvinylalcohol or high frequency or the like, or combination thereof.

However, in chemical cleaning, an acid type cleaning agent is insufficient in removing particles, although it has high ability to remove CuO, and highly acidic solution corrodes even Cu wiring. In addition, hydrofluoric acid type cleaning agent etches even $SiO_2$ of interlayer dielectrics because the agent has characteristics to dissolve $SiO_2$. Further, neutral and alkaline cleaning agent are generally insufficient in removing CuO due to their low ability to dissolve CuO, although they have high ability to remove particles without corroding Cu wiring.

On the other hand, physical cleaning is insufficient in removing CuO, while it can remove particles physically and does not corrode Cu wiring. Therefore, physical cleaning is generally used together with the above acid type cleaning agents. However, since the above problems caused by the acid type cleaning agent can not be avoided even in a combined use of physical cleaning and chemical cleaning agents, it is required to manage to use as weak as possible acid and to shorten cleaning period, and sometimes sufficient removal of CuO, particles can not be expected.

Thus, an effective mean is not presently available by which both CuO and particles remaining on the surface of a semiconductor on which Cu wiring is provided can be removed at the same time by easy operation.

The present invention is completed considering such situations, and provides a cleaning agent and a method for cleaning the surface of a semiconductor on which copper wiring is provided.

DISCLOSURE OF THE INVENTION

The present invention is directed to solve the above problems and relates to a cleaning agent containing a compound the molecule of which has a nitrogen atom having an unshared electron pair, to be used for the surface of a semiconductor on which copper wiring is provided.

Further, the present invention relates to a method for cleaning the surface of a semiconductor, characterized in that the surface of a semiconductor on which Cu wiring is provided is treated with a cleaning agent containing a compound the molecule of which has a nitrogen atom having an unshared electron pair.

Still further, the present invention relates to a method for cleaning the surface of a semiconductor, characterized in that the surface of a semiconductor on which Cu wiring is provided is subjected to a physical cleaning process in the presence of a cleaning agent containing a compound the molecule of which has a nitrogen atom having an unshared electron pair.

The inventors earnestly studied to attain the above-described objective, and found out the fact that CuO and particles adhered on the surface of a semiconductor in Cu-CMP step can be removed by cleaning the semiconductor surface on which Cu wiring is provided by using a cleaning agent containing a compound, the molecule of which has a nitrogen atom having an unshared electron pair, as an effective component of cleaning action, without corroding Cu wiring (Cu thin film) and $SiO_2$ as interlayer dielectrics and also without impairing planarization of the surface, and finally completed the present invention.

BEST MODE FOR CARRYING OUT THE INVENTION

A compound in accordance with the present invention containing a nitrogen atom having an unshared electron pair in the molecule (hereinafter, abbreviated as a compound in accordance with the present invention) may be a compound containing one or more nitrogen atoms having an unshared electron pair in the molecule, for example, a compound having N—N, N═N, N—C or N═C bond in the molecule.

More specifically, the compound includes a compound containing a primary to tertiary amino group, an imino group, an azo group or an azomethine group.

Further more specifically, a compound containing a primary to tertiary amino group, an imino group, an azo group or an azomethine group includes those shown by the following general formulas [1], [2], [3], [4] or [5]:

[1]

[wherein, $R_1$ is an alkyl group that may have a hydroxyl group, a carboxyl group or a phosphonic acid group, a group shown by the following general formula [6]:

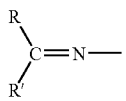
[6]

(wherein, each of R and R' is independently a hydrocarbon group), or a group shown by the following general formula [7]:

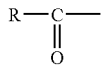
[7]

(wherein R is same as the above); and each of $R_2$ and $R_3$ is independently a hydrogen atom or an alkyl group that may have a hydroxyl group, a carboxyl group or a phosphonic acid group, and $R_1$-$R_3$ may combine with each other to form an aromatic ring or an aromatic condensed ring containing a nitrogen atom in the ring member];

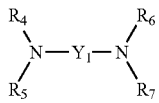
[2]

(wherein, each of $R_4$-$R_7$ is independently a hydrogen atom or an alkyl group that may have a hydroxyl group, a carboxyl group or a phosphonic acid group; and $Y_1$ is a bond, a divalent hydrocarbon group,

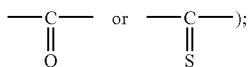

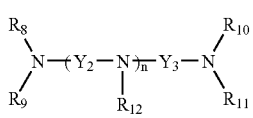
[3]

(wherein, each of $R_8$-$R_{12}$ is independently a hydrogen atom or an alkyl group that may have a hydroxyl group, a carboxyl group or a phosphonic acid group; each of $Y_2$ and $Y_3$ is independently an alkylene group; and n is an integer 1 or more);

$$R_{13}X=NR_{15} \quad [4]$$

(wherein, X is $=CR_{14}$ or a nitrogen atom; and each of $R_{13}$-$R_{15}$ is independently a hydrogen atom or a hydrocarbon group that may have a hydroxyl group or a carboxyl group, or a monovalent group derived from a heterocycle having a nitrogen atom as a ring member atom);

$$R_{16}\text{-}R_{17} \quad [5]$$

(wherein, each of $R_{16}$ and $R_{17}$ is independently a monovalent group derived from a heterocycle having a nitrogen atom as a ring member atom.)

In the general formulas [1]-[3], the alkyl group shown by $R_1$-$R_{12}$ that may have hydroxyl group, carboxyl group or phosphonic acid group may be straight chained, branched or cyclic having generally 1-6 carbon atoms, and specifically includes, for example, a methyl group, an ethyl group, a n-propyl group, an isopropyl group, a cyclopropyl group, a n-butyl group, an isobutyl group, a sec-butyl group, a tert-butyl group, a n-pentyl group, an isopentyl group, a tert-pentyl group, a 1-methylpentyl group, a cyclopentyl group, a n-hexyl group, an isohexyl group, and a cyclohexyl group.

In this connection, generally 1-3 groups, preferably 1 group in a molecule of a hydroxyl group, a carboxyl group or a phosphonic acid group is substituted at an optional position.

The hydrocarbon group shown by $R_{13}$-$R_{15}$ in the general formula [4] that may have a hydroxy group or a carboxyl group includes an alkyl group, an alkenyl group, an aryl group and an aralkyl group.

The alkyl group may be straight chained, branched or cyclic having generally 1-6 carbon atoms, and specifically includes, for example, a methyl group, an ethyl group, a n-propyl group, an isopropyl group, a cyclopropyl group, a n-butyl group, an isobutyl group, a sec-butyl group, a tert-butyl group, a n-pentyl group, an isopentyl group, a tert-pentyl group, a 1-methylpentyl group, a cyclopentyl group, a n-hexyl group, an isohexyl group and a cyclohexyl group.

The alkenyl group includes those having generally 2-6 carbon atoms, and specifically, for example, a vinyl group, an allyl group, a 1-propenyl group, an isopropenyl group, a 3-butenyl group, a 2-butenyl group, a 1-butenyl group, a 1,3-butadienyl group, a 4-pentenyl group, a 3-pentenyl group, a 2-pentenyl group, a 1-pentenyl group, a 1,3-pentadienyl group, a 2,4-pentadienyl group, a 1,1-dimethyl-2-propenyl group, a 1-ethyl-2-propenyl group, a 1,2-dimethyl-1-propenyl group, a 1-methyl-1-butenyl group, a 5-hexenyl group, a 4-hexenyl group, a 2-hexenyl group, a 1-hexenyl group, a 1-cyclopropenyl group, a 2-cyclopropenyl group, a 2,4-cyclopentadienyl group, a 2-cyclohexenyl group, a 1-cyclohexenyl group, a 2-cyclohexenyl group and a 3-cyclohexenyl group.

The aryl group includes those having generally 6-14 carbon atoms, and specifically, for example, a phenyl group, an o-tolyl group, a m-tolyl group, a p-tolyl group, a 2,3-xylyl group, a 2,4-xylyl group, a 2,5-xylyl group, a 2,6-xylyl group, a 3,5-xylyl group, a naphthyl group and an anthryl group.

The aralkyl group includes those having generally 7-12 carbon atoms, and specifically, for example, a benzyl group, a phenethyl group, a phenylpropyl group, a phenylbutyl group, a phenylhexyl group, a methylbenzyl group, a methylphenethyl group and an ethylbenzyl group.

In this connection, generally 1-3 groups, preferably 1 group in a molecule of a hydroxyl group, a carboxyl group or a phosphonic acid group is substituted at an optional position.

The monovalent group shown by $R_{13}$-$R_{15}$ in the general formula [4] derived from heterocycle having a nitrogen atom as the ring member atom includes those derived from generally 5- to 6-membered heterocycles having generally 1-4 nitrogen atoms, and specifically, for example, a pyrrolyl group, a 2H-pyrrolyl group, an imidazolyl group, a pyrazolyl group, a triazolyl group, a pyridyl group, a pyrazyl group, a pyrimidyl group, a pyridazyl group and a tetrazyl group.

The monovalent group shown by $R_{16}$ and $R_{17}$ in the general formula [5] derived from heterocycles having a nitrogen atom as the ring member atom includes those derived from generally 5- to 6-membered heterocycles having generally 1-4 nitrogen atoms, and specifically, for example, a pyrrolyl group, a 2H-pyrrolyl group, an imidazolyl group, a pyrazolyl group, a triazolyl group, a pyridyl group, a pyrazyl group, a pyrimidyl group, a pyridazyl group and a tetrazyl group.

In this connection, the compound shown by the general formula [5] has a structure where two of the above monovalent groups shown by $R_{16}$ and $R_{17}$ respectively, derived from heterocycles having a nitrogen atom as a constituent atom links together between the carbon atom of each group.

A hydrocarbon group shown by R and R' in the general formula [6]:

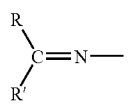

or the general formula [7]:

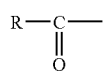

as $R_1$ in the general formula [1] includes, for example, an alkyl group, an alkenyl group, an aryl group and an aralkyl group.

The alkyl group may be straight chained, branched or cyclic having generally 1-6 carbon atoms, specifically, for example, a methyl group, an ethyl group, a n-propyl group, an isopropyl group, a cyclopropyl group, a n-butyl group, an isobutyl group, a sec-butyl group, a tert-butyl group, a n-pentyl group, an isopentyl group, a tert-pentyl group, a 1-methylpentyl group, a cyclopentyl group, a n-hexyl group, an isohexyl group and a cyclohexyl group.

The alkenyl group includes those having generally 2-6 carbon atoms, specifically, for example, a vinyl group, an allyl group, a 1-propenyl group, an isopropenyl group, a 3-butenyl group, a 2-butenyl group, a 1-butenyl group, a 1,3-butadienyl group, a 4-pentenyl group, a 3-pentenyl group, a 2-pentenyl group, a 1-pentenyl group, a 1,3-pentadienyl group, a 2,4-pentadienyl group, a 1,1-dimethyl-2-propenyl group, a 1-ethyl-2-propenyl group, a 1,2-dimethyl-1-propenyl group, a 1-methyl-1-butenyl group, a 5-hexenyl group, a 4-hexenyl group, a 2-hexenyl group, a 1-hexenyl group, a 1-cyclopropenyl group, a 2-cyclopropenyl group, a 2,4-cyclopentadienyl group, a 2-cyclohexenyl group, a 1-cyclohexenyl group, a 2-cyclohexenyl group and a 3-cyclohexenyl group.

The aryl group includes those having generally 6-14 carbon atoms, specifically, for example, a phenyl group, an o-tolyl group, a m-tolyl group, a p-tolyl group, a 2,3-xylyl group, a 2,4-xylyl group, a 2,5-xylyl group, a 2,6-xylyl group, a 3,5-xylyl group, a naphthyl group and an anthryl group.

The aralkyl group includes those having generally 7-12 carbon atoms, specifically, for example, a benzyl group, a phenethyl group, a phenylpropyl group, a phenylbutyl group, a phenylhexyl group, a methylbenzyl group, a methylphenethyl group and an ethylbenzyl group.

The aromatic ring having nitrogen atoms in the ring member atom formed by mutual bonding of $R_1$-$R_3$ in the general formula [1] includes those of generally 5- to 6-membered, preferably 6-membered ring containing generally 1-4, preferably 1-2 nitrogen atoms in the ring member atoms, and specifically, for example, a pyrrole ring, a 2H-pyrrole ring, an imidazole ring, a pyrazole ring, a triazole ring, a tetrazole ring, a pyridine ring, a pyrazine ring, a pyrimidine ring, a pyridazine ring, a triazine ring and a tetrazine ring.

The aromatic condensed ring having nitrogen atoms in the ring member atoms formed by mutual bonding of $R_1$-$R_3$ in the general formula [1] includes a condensed ring formed by the condensation of generally 2 or more, preferably 2 of generally 5- to 6-membered, preferably 6-membered aromatic rings containing generally 1-4, preferably 1-2 nitrogen atoms in the above ring, or a condensed ring formed by the condensation of generally 1 or more, preferably 1-2 of said aromatic rings and generally 1 or more, preferably 1-2 of benzene rings, and specifically, for example, an indole ring, an isoindole ring, an indolizine ring, a carbazole ring, a quinoline ring, an isoquinoline ring, a 4H-quinolizine ring, a phenanthridine ring, an acridine ring, a benzimidazole ring, a 1H-indazole ring, a 1,8-naphthylidine ring, a quinoxaline ring, a quinazoline ring, a cinnoline ring, a phthalazine ring, a purine ring, a pteridine ring, a perimidine ring, a 1,10-phenanthroline ring, a phenazine ring, a benztriazole ring and a benzotriazine ring.

The divalent hydrocarbon group shown by $Y_1$ in the general formula [2] includes, for example, an alkylene group, a divalent aromatic group and a divalent aromatic aliphatic group.

The alkylene group may be straight chained, branched or cyclic having generally 1-10 carbon atoms, and specifically, for example, a metylene group, an ethylene group, a trimethylene group, a propylene group, a tetramethylene group, a butylene group, a 2-methylpropylene group, a pentamethylene group, a pentylene group, a 2,2-dimethylpropylene group, a 2-ethylpropylene group, a hexamethylene group, a hexylene group, a heptylene group, an octylene group, a 2-ethylhexylene group, a nonylene group, a decylene group, a cyclopropylene group, a cyclopentylene group, a cyclohexylene group, an adamantanediyl group, a tricyclo[5.2.1.0$^{2,6}$]decanediyl group, a norbornanediyl group, a methylnorbornanediyl group, an isobornanediyl group and a decalinediyl group.

The divalent aromatic group includes, for example, an o-phenylene group, a m-phenylene group, a p-phenylene group, a diphenylene group and a p-xylene-α,α'-diyl group.

The divalent aromatic aliphatic group includes, for example, those groups constituted of the above alkylene group and aromatic group.

Here, $Y_1$ in the general formula [2] is preferably a bond, the divalent hydrocarbon group, or the following group:

The alkylene group shown by $Y_2$-$Y_3$ in the general formula [3] may be straight chained, branched or cyclic, and includes those groups having generally 1-10 carbon atoms, and specifically, for example, a metylene group, an ethylene group, a trimethylene group, a propylene group, a tetramethylene group, a butylene group, a 2-methylpropylene group, a pentamethylene group, a pentylene group, a 2,2-dimethylpropylene group, a 2-ethylpropylene group, a hexamethylene group, a hexylene group, a heptylene group, an octylene group, a 2-ethylhexylene group, a nonylene group, a decylene group, a cyclopropylene group, a cyclopentylene group, a cyclohexylene group, an adamantanediyl group, a tricyclo [$5.2.1.0^{2.6}$] decanediyl group, a norbornanediyl group, a methylnorbornanediyl group, an isobornanediyl group and a decalinediyl group.

Among the compounds shown by the above general formula [1], a compound shown by the following general formula [1'] is preferable:

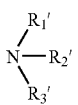

[1']

[wherein, $R_1'$ is an alkyl group that may have a hydroxyl group, a carboxyl group or a phosphonic acid group, a group shown by the following general formula [6]:

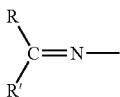

[6]

(wherein, each of R and R' is independently a hydrocarbon group); or a group shown by the following general formula [7]:

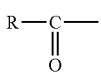

[7]

(wherein R is same as the above); and each of $R_2'$ and $R_3'$ is independently a hydrogen atom or an alkyl group that may have a hydroxyl group, a carboxyl group or a phosphonic acid group].

The alkyl group shown by $R_1'$-$R_3'$ in the general formula [1'] that may have a hydroxyl group, a carboxyl group or a phosphonic acid group, is same as an alkyl group shown by $R_1$-$R_3$ in the above general formula [1] that may have a hydroxyl group, a carboxyl group or a phosphonic acid group. R and R' in the groups shown by the above general formulae [6] and [7] are also same as the above.

A compound shown by the above general formula [1] includes specifically a primary amine such as methylamine, ethylamine, propylamine, ethanolamine and aniline, a secondary amine such as dimethylamine, methylethylamine, diethylamine and dipropylamine, a tertiary amine such as trimethylamine, dimethylethylamine, methyldiethylamine, triethylamine and tripropylamine, hydroxy-containing tertiary amine such as dimethylethanolamine, diethylethanolamine and triethanolamine, acyclic amino acids such as glycine, alanine, aspartic acid, glutamic acid, valine, leucine, serine, threonine, lycine and arginine, cyclic amino acids such as phenylalanine, tyrosine, histidine, tryptophan, proline and aminobenzoic acid, aminopolycarboxylic acids such as hydroxyethylimino diacetate (HIDA), imino diacetate (IDA), nitrilo triacetate (NTA) and nitrilotripropionic acid (NTP), aminopolyphosphonic acids such as nitrilotris (methylene phosphonic acid) (NTPO), quinolines such as 8-quinolinol, pyridine derivatives such as nicotinic acid and picolinic acid, pyrazoles such as 4-pyrazole carboxylic acid, porphyrins such as 5,10,15,20-tetraphenyl-21H,23H-porphyrin tetrasulfonic acid (TPPS), pyrazines such as 2,3-pyrazinedicarboxylic acid, amidos such as N-acetylglycine and benzilamido, hydrazones such as bicyclohexanone oxalylhydrazone (BCOD), and o-phenanthroline or its derivative.

A compound shown by the above general formula [1'] includes specifically a primary amine such as, methylamine, ethylamine, propylamine, ethanolamine and aniline, a secondary amine such as dimethylamine, methylethylamine, diethylamine and dipropylamine, a tertiary amine such as trimethylamine, dimethylethylamine, methyldiethylamine, triethylamine and tripropylamine, hydroxy-containing tertiary amine such as dimethylethanolamine, diethylethanolamine and triethanolamine, acyclic amino acids such as glycin, alanine, aspartic acid, glutamic acid, valine, leucine, serine, threonine, lycine and arginine, aminopolycarboxylic acids such as hydroxyethylimino diacetate (HIDA), iminodiacetate (IDA), nitrilo triacetate (NTA) and nitrilotripropionic acid (NTP) and aminopolyphosphonic acids such as nitrilotris (methylene phosphonic acid) (NTPO).

A compound shown by the above general formula [2] includes specifically diamines such as ethylenediamine, propylenediamine, isopropyldiamine and butyldiamine, aminopolycarboxylic acids such as ethylejnediamine tetraacetate (EDTA), trans-1,2-diaminocyclohexane-N,N,N', N'-tetraacetate (CyDTA), diaminopropanol tetraacetate (DPTA-OH), ethylenediamine diacetate (EDDA), ethylenediamine dipropionic acid dichloride (EDDP), hydroxyethylethylenediamine triacetate (EDTA-OH), glycoletherdiamine tetraacetate (GEDTA), 1,6-hexamethylenediamine-N,N,N',N'-tetraacetate (HDTA) and diaminopropane tetraacetate (Methyl-EDTA), aminopolyphosphonic acids such as ethylenediaminetetrakis (methylenephosphonic acid) (EDTPO), ethylenediamine-N,N'-bis (methylenephosphonic acid) (EDDPO) and isopropyldiaminetetrakis (methylenephosphonic acid), quinaldines such as quinaldic acid, aromatic diamines such as diaminobenzene and diaminonaphthalene, ureas such as urea and uric acid, thioureas such as thiourea and thiosemicarbazide.

A compound shown by the above general formula [3] includes specifically polyamines such as diethylenetriamine, dipropylenetriamine and triethylenetetraamine, aminopolycarboxylic acids such as triethylenetetramine hexaacetate (TTHA) and diethylenetriamine-N,N,N',N'',N''-pentaacetate (DTPA), aminopolyphosphonic acids such as diethylenetriamine-N,N,N',N'',N''-penta (methylenephosphonic acid).

A compound shown by the above general formula [4] includes specifically azobenzenes such as 2,2'-dihydroxyazobenzene, calcichrome, calmagite and lumogallion, azomethines such as o-salicylideneaminophenol, hydrazines such as hydrazinobenzene sulfonic acid, triazins such as cyanuric acid, pyridylazos such as 1-(2-pyridylazo)-2-naphthol (PAN) and 4-(2-pyridylazo) resorcinol (PAR), aromatic polyamines such as triaminobenzene.

A compound shown by the above general formula [5] includes specifically dipyridyls or derivatives thereof such as 2,2'-dipyridyl and 4,4'-dipyridyl.

Among these compounds, the compounds shown by the above general formulas [1'], [2] and [3] are preferable, in particular diamines, polyamines, aminopolycarboxylic acid, aminopolyphosphonic acids, thioureas and acyclic amino acids are particularly preferable, and specifically, they include preferably ethylenediamine, diethylenetriamine, diethylenetriamine-N,N,N',N'',N''-pentaacetate (DTPA), ethylenediaminetetrakis (methylenephosphonic acid) (EDTPO), thiourea, glycine and alanine. Diamines, polyamines, aminopolycarboxylic acids, aminopolyphosphonic acids and acyclic amino acids are more preferable, and specifically, they include ethylenediamine, diethylenetriamine, diethylenetriamine-N,N,N',N'',N''-pentaacetate (DTPA), ethylenediaminetetrakis (methylenephosphonic acid) (EDTPO), glycine and alanine.

A compound in accordance with the present invention described above may be used alone or optionally in combination of two or more compounds.

An amount to be used of a compound in accordance with the present invention is generally 0.0001-30% by weight, preferably 0.001-1% by weight, more preferably 0.001-0.1% by weight to the total amount of the cleaning agent.

When two or more compounds in accordance with the present invention are used in combination, the total amount of each compound is generally 0.0001-30% by weight, preferably 0.001-1% by weight, more preferably 0.001-0.1% by weight to the total amount of the cleaning agent.

A cleaning agent of the present invention is generally in a state of aqueous solution and prepared by adding and dissolving the above-described compound in accordance with the present invention in water.

A method for adding the compound in accordance with the present invention to a cleaning agent (water) includes, for example, adding the compound in accordance with the present invention separately dissolved in water to a cleaning agent, or adding crystalline or liquid compound in accordance with the present invention directly to water (a cleaning agent) followed by dissolving and stirring, or the like.

A cleaning agent of the present invention thus prepared is preferably filtrated before use. The water to be used in the present invention is preferably purified by distillation, ion exchange or the like, and more preferably so-called ultrapure water to be used in this field.

A cleaning agent of the present invention is preferably weakly acidic to alkaline, generally as of pH 4-13; preferably as of pH 5-12, more preferably as of pH 6-9. In such pH range, $SiO_2$, interlayer dielectrics, has less risk to be etched, and also a cleaning effect for particles and CuO is improved due to enhanced electric repulsion between the surface of a semiconductor and particles.

In order to adjust a cleaning agent of the present invention in the above pH range, a pH adjuster generally used in this field, for example, carboxylic acids such as citric acid, oxalic acid, phthalic acid and tartaric acid, derivatives thereof or salts thereof, phosphoric acid, derivative thereof or salt thereof, and quaternary amines such as tetramethylammonium hydroxide (TMAH), choline may be used, if necessary.

In addition, a cleaning agent of the present invention having a buffer function in the above pH range is particularly preferable. In order to give a buffer function to a cleaning agent of the present invention, a pH adjuster having a buffer function in the above pH range by itself among the above pH adjusters may be used alone or in combination of two or more of these pH adjusters, or in combination with a pH adjuster other than the above. Further, a compound that has no buffer function by itself but can give a buffer function to a cleaning agent of the present invention by using in combination with two or more of other compounds, or in combination with a compound in accordance with the present invention may also be used.

As for an amount to be used of these pH adjusters, although it can not be generally said because of its dependency on the kind of the pH adjuster to be used, an amount may be such level that a solution containing a compound in accordance with the present invention falls within the above pH range when they are added to said solution. For example, it is generally 0.0001-10% by weight, preferably 0.001-1% by weight to the total amount of the cleaning agent.

More specifically, the amount is generally 0.0001-10% by weight, preferably 0.001-1% by weight to the total amount of the cleaning agent when, for example, citric acid is used, and the amount is generally 0.0001-10% by weight, preferably 0.001-1% by weight to the total amount of the cleaning agent when, for example, TMAH is used, and the amount is generally 0.0001-10% by weight, preferably 0.001-1% by weight to the total amount of the cleaning agent when choline is used.

Further, reagents other than the above compound in accordance with the present invention, that are generally used in this field, can be used in a cleaning agent of the present invention.

Such reagents includes reducing agents such as hydrazine or derivatives thereof, ascorbic acid, formic acid and formalin, metal corrosion inhibitors, for example, benzotriazoles or derivatives therof (which include, for example, benzotriazole compounds having on a benzotriazole ring a substituent such as carboxylic group, a lower alkyl group such as a methyl group, an ethyl group and a propyl group, a halogen atom such as a fluorine atom, a chlorine atom, a bromine atom and an iodine atom, and specifically, for example, 4-carboxybenzotriazole, 5-carboxybenzotriazole, 4-methylbenzotriazole, 5-methylbenzotriazole and 5-chlorobenzotriazole) thioureas and thiol compounds such as mercaptothiazole, mercaptoethnol and thioglycerol, which are used for the purpose of, for example, protecting Cu for wiring and preventing corrosion of Cu, nonionic surfactants such as NCW601A (polyoxyethylenealkylphenylether made by Wako Pure Chemical Industries, Ltd.) and NCW1002 (polyoxyalkylenealkylether made by Wako Pure Chemical Industries, Ltd.), anionic surfactants such as dodecylbenzenesulfonic acid, cationic surfactants such as alkyltrimethylammonium, amphoteric surfactants such as carboxybetaine, which are used for the purpose to improve wettability of a cleaning agent to the surface of a semiconductor for an enhanced cleaning effect.

These reagents may be used in the range of concentration generally used in this field.

For example, an amount of the reducing agent to be used may be such amount that can prevent metal Cu from being oxidized, and is generally 0.01-5% by weight, preferably 0.05-1% by weight. An amount of the metal corrosion inhibitor to be used may be such amount that it can suppress the dissolving power of cleaning agent for Cu by forming a weak bond with metal Cu, and is generally 0.01-5% by weight, preferably 0.05-1% by weight. An amount of the surfactant to be used may be such amount that it can lower the surface tension of cleaning agent, and is generally 0.0001-1% by weight, preferably 0.001-0.1% by weight.

In a more preferable embodiment of a cleaning agent of the present invention, the cleaning agent comprises the above-described compound in accordance with the present invention, the above-described pH adjuster and metal corrosion inhibitor.

A cleaning agent of the present invention utilizes a nature possessed by a compound in accordance with the present invention contained therein that when the compound attacks both of a copper atom of CuO on the surface of a semiconductor and a copper atom of Cu wiring, the compound dissolves easily the copper atom of CuO by forming a complex with it, while it hardly dissolves (corrodes) the copper atom of the Cu wiring because of extremely lower dissolution rate of the copper atom of Cu wiring compared with that of the copper atom of CuO. Therefore, when the cleaning agent of the present invention is applied to the surface of a semiconductor on which Cu wiring is provided, the cleaning agent can selectively dissolve only CuO and remove CuO and particles on the surface of a semiconductor at the same time without corroding Cu wiring, Cu thin film, $SiO_2$ as interlayer dielectrics and the like.

A cleaning method of the present invention may be conducted by treating the surface of a semiconductor on which Cu wiring is provided, using a cleaning agent comprising the above compound in accordance with the present invention, and if necessary, further pH adjusters, reducing agents, metal corrosion inhibitors, surfactants and the like, or a cleaning agent comprising the above compound in accordance with the present invention, pH adjusters, metal corrosion inhibitors, and if necessary, further reducing agents, surfactants and the like.

A method to treat the surface of a semiconductor on which Cu wiring is provided, using a cleaning agent of the present invention may be a method to make clean the surface of a semiconductor generally used and known in this field, and specifically a method such as dipping treatment to simply dip a semiconductor in the cleaning agent and the single-wafer-based treatment to shower the cleaning agent on a semiconductor, and the like.

Further, in the present invention, CuO can be removed more effectively by using physical cleaning at the same time. The specific method of the combined use is conducting physical cleaning for the surface of the semiconductor on which the Cu wiring is provided in the presence of the cleaning agent of the invention, or the like.

In the above method, a specific method to provide a cleaning agent of the present invention on the surface of a semiconductor includes a method to apply a physical cleaning process in a state in which a cleaning agent of the present invention exists by the treatment such as dipping treatment and single wafer treatment as described above.

A physical cleaning (step) includes, for example, brush-scrub cleaning to clean the surface of a semiconductor with a high-speed rotation brush made of polyvinylalcohol and megasonic cleaning to use high frequency.

A more specific technique in the case of combined use with a physical cleaning includes, for example, a method to apply a physical cleaning after providing a cleaning agent of the present invention on the surface of a semiconductor by dipping the semiconductor in said cleaning agent and then taking it out of said cleaning agent, a method to apply a physical cleaning while a semiconductor is dipped in a cleaning agent of the present invention, a method to apply a physical cleaning after providing a cleaning agent of the present invention on the surface of a semiconductor by showering said cleaning agent on the surface of the semiconductor, or a method to apply a physical cleaning while a cleaning agent of the present invention is showered on the surface of a semiconductor.

Hereinbelow, examples and comparative examples are given below, but the present invention should not be restricted by these examples.

EXAMPLES

Each of CuO contaminated wafer and metal Cu deposited wafer used in examples and comparative examples were prepared by the following methods, and each of concentration of remaining CuO (remaining CuO concentration), amount of remaining particles adsorbed on the surface of CuO contaminated wafer and film thickness of metal Cu on the surface of metal Cu deposited wafer were measured by the following methods.

[CuO Contaminated Wafer]

A CuO contaminated wafer was prepared by dipping a 4-inch silicon wafer with a surface converted to $SiO_2$ by thermal oxidation in slurry aqueous solution containing 3% alumina added with Cu to be 1 ppm for 1 minute, and then rinsing it with running ultrapure water for 10 minutes followed by spin drying.

It was confirmed by the following methods that $5 \times 10^{14}$ atoms/$cm^2$ of Cu presumed to remain in the form of CuO, and about 8500/4-inch wafer of particles presumed to be derived from alumina, were adsorbed and remained on said CuO contaminated wafer.

[Metal Cu Deposited Wafer]

A metal Cu deposited wafer was prepared by depositing metal Cu to be 1000 Å thick on the surface of a 4-inch silicon wafer by sputtering.

[Measuring Method for CuO Concentration]

Remaining CuO adsorbed on the wafer surface was dissolved and recovered by nitric acid—hydrofluoric acid solution, and then Cu concentration in the recovered solution was measured by a graphite furnace atomic absorption spectrometer. The (remaining) CuO concentration was determined from the measured value.

[Measuring Method for Particle Amount]

An amount of remaining particles adsorbed on the wafer surface was counted by a surface foreign material inspection equipment (particle counter).

[Measuring Method for Metal Cu Film Thickness]

A film thickness of metal Cu was determined by observing a cross-section of the wafer divided into halves using an electron microscope.

All units of concentration such as %, ppm and ppb are exhibited in weight base unless otherwise stated. All water used was ultrapure water which was confirmed not to contain Cu of more than 0.01 ppb.

Example 1

A CuO contaminated wafer and a metal Cu deposited wafer prepared by the above methods were dipped in a cleaning agent (pH 12) in a cleaning bath, prepared by dissolving 0.01% of triethanolamine, a compound in accordance with the present invention, in ultrapure water for 10 minutes at room temperature. The wafers were then taken out of the cleaning bath, rinsed with ultrapure water for 10 minutes and spin-dried. Remaining CuO concentration and amount of remaining particle adsorbed on the surface of CuO contaminated wafer thus treated were measured to evaluate performance of removing impurities, while film thickness of metal Cu on the surface of metal Cu deposited wafer thus treated was measured to check whether metal Cu was corroded. Results are shown in Table 1. The symbols ↑ and ↓ in Table 1 mean "above" and "below", respectively.

Example 2

A CuO contaminated wafer and a metal Cu deposited wafer were treated by the similar method as in example 1, except that a cleaning agent (pH 7) prepared by dissolving 0.01% of 2,2'-dipyridyl, a compound in accordance with the present invention, was used instead of triethanolamine, and then remaining CuO concentration, amount of remaining particle on the surface of CuO contaminated wafer and film thickness of metal Cu on the surface of metal Cu deposited wafer were measured. Results are also shown in Table 1.

Example 3

A CuO contaminated wafer and a metal Cu deposited wafer were treated by the similar method as in example 1, except that a cleaning agent prepared by dissolving 0.1% of EDTA, a compound in accordance with the present invention, was used instead of triethanolamine by adjusting pH at 12 using TMAH as a pH adjuster, and then remaining CuO concentration, amount of remaining particle on the surface of CuO contaminated wafer and film thickness of metal Cu on the surface of metal Cu deposited wafer were measured. Results are also shown in Table 1.

Example 4

A CuO contaminated wafer and a metal Cu deposited wafer were treated by the similar method as in example 1, except that a cleaning agent prepared by dissolving 0.5% of ethylenediamine, a compound in accordance with the present invention, was used instead of triethanolamine by adjusting pH at 5 using citric acid as a pH adjuster, and then remaining CuO concentration, amount of remaining particle on the surface of CuO contaminated wafer and film thickness of metal Cu on the surface of metal Cu deposited wafer were measured. Results are also shown in Table 1.

Example 5

A CuO contaminated wafer and a metal Cu deposited wafer were treated by the similar method as in example 1, except that a cleaning agent (pH 12) prepared by dissolving 0.2% of nitrilotris (methylenephosphonic acid) and 0.8% of ethanolamine, both compounds in accordance with the present invention, was used instead of triethanolamine, and then remaining CuO concentration, amount of remaining particle on the surface of CuO contaminated wafer and film thickness of metal Cu on the surface of metal Cu deposited wafer were measured. Results are also shown in Table 1.

Example 6

A CuO contaminated wafer and a metal Cu deposited wafer were treated by the similar method as in example 1, except that a cleaning agent (pH 7) prepared by dissolving 0.05% of o-phenanthroline, a compound in accordance with the present invention, instead of triethanolamine, 0.02% of NCW601A (trade name of polyoxyethylenealkylphenylether made by Wako Pure Chemical Industries, Ltd.), a surfactant, was used, and then remaining CuO concentration, amount of remaining particle on the surface of CuO contaminated wafer and film thickness of metal Cu on the surface of metal Cu deposited wafer were measured. Results are also shown in Table 1.

Example 7

A CuO contaminated wafer and a metal Cu deposited wafer were treated by the similar method as in example 1, except that a cleaning agent prepared by dissolving 1% of ethylenediaminetetrakis (methylenephosphonic acid), a compound in accordance with the present invention, instead of triethanolamine and 0.02% benzotriazole, a metal corrosion inhibitor, was used by adjusting pH at 9 using choline as a pH adjuster, and then remaining CuO concentration, amount of remaining particle on the surface of CuO contaminated wafer and film thickness of metal Cu on the surface of metal Cu deposited wafer were measured. Results are also shown in Table 1.

Example 8

A CuO contaminated wafer and a metal Cu deposited wafer were treated by the similar method as in example 1, except that a cleaning agent (pH 7) prepared by dissolving 0.2% of 2,2'-dihydroxyazobenzene, a compound in accordance with the present invention, instead of triethanolamine and 0.5% of hydrazine, a reducing agent, was used, and then remaining CuO concentration, amount of remaining particle on the surface of CuO contaminated wafer and film thickness of metal Cu on the surface of metal Cu deposited wafer were measured. Results are also shown in Table 1.

Comparative Example 1

A CuO contaminated wafer and a metal Cu deposited wafer were treated with ultrapure water (pH 7) alone by the similar method as in example 1, and then remaining CuO concentration, amount of remaining particle on the surface of CuO contaminated wafer and film thickness of metal Cu on the surface of metal Cu deposited wafer were measured. Results are also shown in Table 1.

Comparative Example 2

A CuO contaminated wafer and a metal Cu deposited wafer were treated by the similar method as in example 1, except that a cleaning agent (pH≦1) prepared by dissolving 1% of hydrofluoric acid which was used in conventional chemical cleaning, instead of triethanolamine was used, and then remaining CuO concentration, amount of remaining particle on the surface of CuO contaminated wafer and film thickness of metal Cu on the surface of metal Cu deposited wafer were measured. Results are also shown in Table 1.

Comparative Example 3

A CuO contaminated wafer and a metal Cu deposited wafer were treated by the similar method as in example 1, except that a cleaning agent (pH≦1) prepared by dissolving 5% of hydrochloric acid which was used in conventional chemical cleaning, instead of triethanolamine was used, and then remaining CuO concentration, amount of remaining particle on the surface of CuO contaminated wafer and film thickness of metal Cu on the surface of metal Cu deposited wafer were measured. Results are also shown in Table 1.

Comparative Example 4

A CuO contaminated wafer and a metal Cu deposited wafer were treated by the similar method as in example 1, except that a cleaning agent (pH≧12) prepared by dissolving 0.01% of TMAH, a pH adjuster, in ultrapure water, instead of triethanolamine was used, and then remaining CuO concentration, amount of remaining particle on the surface of CuO contaminated wafer and film thickness of metal Cu on the surface of metal Cu deposited wafer were measured. Results are also shown in Table 1.

Comparative Example 5

A CuO contaminated wafer and a metal Cu deposited wafer were treated by the similar method as in example 1, except that a cleaning agent prepared by dissolving 1% of acetic acid, instead of triethanolamine was used by adjusting pH at 5 using TMAH as a pH adjuster, and then remaining CuO concentration, amount of remaining particle on the surface of CuO contaminated wafer and film thickness of metal Cu on the surface of metal Cu deposited wafer were measured. Results are also shown in Table 1.

Comparative Example 6

A CuO contaminated wafer and a metal Cu deposited wafer were treated by the similar method as in example 1, except that a cleaning agent prepared by dissolving 0.01% of acetylacetone, instead of triethanolamine was used by adjusting pH at 9 using choline as a pH adjuster, and then remaining CuO concentration, amount of remaining particle on the surface of CuO contaminated wafer and film thickness of metal Cu on the surface of metal Cu deposited wafer were measured. Results are also shown in Table 1.

TABLE 1

| | | | CuO Contaminated Wafer | | Metal Cu Deposited Wafer |
| --- | --- | --- | --- | --- | --- |
| | Additive (Addition Amount: % by Weight) | pH | Conc. of Remaining CuO (atom/cm$^2$) | Amount of Particle (Particle/Wafer) | Metal Cu Film Thickness (nm) |
| Example 1 | Triethanolamine (0.01%) | 12 | $5 \times 10^9$↓ | 30↓ | 1000 |
| Example 2 | 2,2'-dipyridyl (0.01%) | 7 | $2 \times 10^{10}$ | 40 | 1000 |
| Example 3 | EDTA (0.1%) TMAH (pH adjuster) | 12 | $1 \times 10^{10}$ | 30↓ | 950 |
| Example 4 | Ethylenediamine (0.5%) Citric acid (pH adjuster) | 5 | $3 \times 10^{10}$ | 34 | 950 |
| Example 5 | Nitrilotris (methylenephosphonic acid) (0.2%) Ethanolamine (0.8%) | 12 | $5 \times 10^9$↓ | 30↓ | 1000 |
| Example 6 | o-Phenanthroline (0.05%) NCW601A (Surfactant: 0.02%) | 7 | $6 \times 10^{10}$ | 30↓ | 950 |
| Example 7 | Ethylenediaminetetrakis (methylenephosphonic acid) (1%) Benzotriazole (Metal corrosion inhibitor: 0.02%) | 9 | $8 \times 10^9$ | 32 | 1000 |
| Example 8 | 2,2'-Dihydroxyazobenzene (0.2%) Hydrazine (reducing agent: 0.5%) | 7 | $5 \times 10^9$↓ | 30↓ | 950 |
| Comparative Example 1 | No additive | 7 | $3 \times 10^{14}$ | 259 | 1000 |
| Comparative Example 2 | Hydrofluoric Acid (1%) | 1↓ | $8 \times 10^{11}$ | 1200 | 150 |
| Comparative Example 3 | Hydrochloric Acid (5%) | 1↓ | $5 \times 10^9$↓ | 850 | 600 |
| Comparative Example 4 | TMAH (pH adjuster: 0.01%) | 12↑ | $3 \times 10^{14}$ | 30↓ | 950 |
| Comparative Example 5 | Acetic acid (1%) TMAH (pH adjuster) | 5 | $1 \times 10^{14}$ | 102 | 950 |
| Comparative Example 6 | Acetylacetone (0.01%) Choline (pH adjuster) | 9 | $4 \times 10^{13}$ | 89 | 1000 |

As obvious from Table 1, the cleaning agents comprising the compounds in accordance with the present invention (examples 1-8) can control the remaining CuO concentration on the surface of CuO contaminated wafer below the order of $10^{10}$, and also the amount of remaining particle adsorbed on the surface of wafer below 40. Further, it can also be seen that the cleaning agents comprising the compounds in accordance with the present invention do not dissolve or etch Cu, judging from the fact that the cleaning agents comprising the compounds in accordance with the present invention have little influence on Cu film thickness on the surface of metal Cu deposited wafer.

In other words, it can be seen that the cleaning agents of the present invention can effectively remove and remaining CuO and particles adsorbed on the surface of a semiconductor on which Cu wiring is provided at the same time, without giving an unfavorable influence on said Cu wiring and Cu thin film of said semiconductor.

On the other hand, it can be seen that the cleaning agents used in conventional chemical cleaning (comparative examples 2-3) are insufficient in removing particles and also dissolve or etch metal Cu remarkably though they give relatively good results in removing CuO. Further, it can be seen that the cleaning agents of comparative examples 1 and 4-6 are insufficient in removing CuO while they are relatively good in removing particles and also do not dissolve or etch metal Cu.

As described above, it can be seen that the cleaning agent having a compound in accordance with the present invention is the only cleaning agent that can effectively remove remaining CuO and particles adsorbed on the surface of a semiconductor on which the Cu wiring is provided at the same time without giving an unfavorable influence on said Cu wiring and Cu thin film of said semiconductor.

Example 9

A CuO contaminated wafer and a metal Cu deposited wafer prepared by the above methods were dipped in the cleaning agent of example 3 (prepared by dissolving 0.1% of EDTA, a compound in accordance with the present invention, in ultrapure water and adjusting pH at 12 using TMAH as a pH adjuster) in a cleaning bath for 10 minutes at room temperature under the high frequency of 1 MHz applied. The wafers were then taken out of the cleaning bath, rinsed with ultrapure water for 10 minutes and spin-dried. Remaining CuO concentration and amount of remaining particle adsorbed on the surface of CuO contaminated wafer thus treated were measured to evaluate performance of removing impurities, while film thickness of metal Cu on the surface of metal Cu deposited wafer thus treated was measured to check whether metal Cu was corroded. Results are shown in Table 2. The symbols ↑ and ↓ in Table 2 mean "above" and "below", respectively.

Comparative Example 7

A CuO contaminated wafer and a metal Cu deposited wafer were treated by the similar method as in example 9, except that a cleaning agent of comparative example 4 (prepared by dissolving 0.01% of TMAH, a pH adjuster, in ultrapure water, (pH≧2)), instead of the cleaning agent of example 3 was used, and then remaining CuO concentration, amount of remaining particle on the surface of CuO contaminated wafer and film thickness of metal Cu on the surface of metal Cu deposited wafer were measured. Results are also shown in Table 2.

TABLE 2

| | Additive (Addition Amount: % by Weight) | pH | CuO Contaminated Wafer | | Metal Cu Deposited Wafer |
|---|---|---|---|---|---|
| | | | Conc. of Remaining CuO (atom/cm$^2$) | Amount of Particle (Particle/Wafer) | Metal Cu Film Thickness (nm) |
| Example 9 | EDTA (0.1%) TMAH (pH adjuster) | 12 | 5 × 10$^9$ ↓ | 30 ↓ | 1000 |
| Comparative Example 7 | TMAH (pH adjuster: 0.01%) | 12 ↑ | 1 × 10$^{13}$ | 30 ↓ | 1000 |

As obvious from Table 1 and Table 2, the cleaning agent containing a compound in accordance with the present invention can remove CuO more effectively by conducting combined chemical and physical cleaning (high frequency cleaning) (example 9) than by the case of conducting chemical cleaning alone (example 3).

On the other hand, it can be seen that in the case of a conventional cleaning agent, the combined use of chemical and physical cleaning (comparative example 7) is better than chemical cleaning alone (comparative example 4), but still less effective in removing CuO than chemical cleaning alone using the cleaning agent containing the compounds in accordance with the present invention.

Example 10

A CuO contaminated wafer and a metal Cu deposited wafer prepared by the above method were washed for 1 minute with a high-speed rotation brush made of polyvinylalcohol while showered at room temperature with the cleaning agent of example 4 (prepared by dissolving 0.5% of ethylenediamine, a compound in accordance with the present invention, in ultrapure water and adjusting pH at 5 using citric acid as a pH adjuster). The wafers were then rinsed with ultrapure water for 10 minutes and spin-dried. Remaining CuO concentration and amount of remaining particle adsorbed on the surface of CuO contaminated wafer thus treated were measured to evaluate performance of removing impurities, while film thickness of metal Cu on the surface of metal Cu deposited wafer thus treated was measured to check whether metal Cu was corroded. Results are shown in Table 3. The symbols ↑ and ↓ in Table 3 mean "above" and "below", respectively.

Comparative Example 8

A CuO contaminated wafer and a metal Cu deposited wafer were treated by the similar method as in example 10, except that a cleaning agent of comparative example 5 (prepared by dissolving 1% of acetic acid in ultrapure water and adjusting pH at 5 using TMAH as a pH adjuster), instead of the cleaning agent of example 4 was used, and then remaining CuO concentration, amount of remaining particles on the surface of CuO contaminated wafer and film thickness of metal Cu on the surface of metal Cu deposited wafer were measured. Results are also shown in Table 3.

TABLE 3

| | Additive (Addition Amount: % by Weight) | pH | CuO Contaminated Wafer | | Metal Cu Deposited Wafer |
|---|---|---|---|---|---|
| | | | Conc. of Remaining CuO (atom/cm$^2$) | Amount of Particle (Particle/Wafer) | Metal Cu Film Thickness (nm) |
| Example 10 | Ethylenediamine (0.5%) Citric acid (pH adjuster) | 5 | 5 × 10$^9$ ↓ | 30 ↓ | 950 |
| Comparative Example 8 | Acetic Acid (1%) TMAH (pH adjuster) | 5 | 9 × 10$^{12}$ | 51 | 950 |

As obvious from Table 1 and Table 3, the cleaning agent containing the compounds in accordance with the present invention can remove CuO and particle more effectively by conducting combined chemical and physical cleaning (brush-scrub cleaning) (example 10) than by conducting chemical cleaning alone (example 4).

On the other hand, it can be seen that in the case of the conventional cleaning agents, a combined use of chemical and physical cleaning (comparative example 8) gives an improved effect in removing CuO compared with chemical cleaning alone (comparative example 5), but still less effective and insufficient than chemical cleaning alone using the cleaning agent containing the compound in accordance with the present invention.

Example 11

A CuO contaminated wafer and a metal Cu (deposited wafer were treated by the similar method as in example 1, except that a cleaning agent prepared by dissolving 0.5% of ethylenediamine, a compound in accordance with the present invention, instead of triethanolamine and 0.001% of mercaptoimidazole, a metal corrosion inhibitor, and adjusting pH at 10 using citric acid as a pH adjuster was used, and then remaining CuO concentration, amount of remaining particle on the surface of CuO contaminated wafer and film thickness of metal Cu on the surface of metal Cu deposited wafer were measured. Results are shown in Table 4.

Example 12

A CuO contaminated wafer and a metal Cu deposited wafer were treated by the similar method as in example 1, except that a cleaning agent prepared by dissolving 0.5% of ethylenediamine, a compound in accordance with the present invention, instead of triethanolamine and 0.01% of 3-mercapto-1-propanol, a metal corrosion inhibitor, and adjusting pH at 10 using citric acid as a pH adjuster, was used, and then remaining CuO concentration, amount of remaining particle on the surface of CuO contaminated wafer and film thickness of metal Cu on the surface of metal Cu deposited wafer were measured. Results are also shown in Table 4. Results of comparative examples 1-6 are also shown in Table 4.

TABLE 4

| | Additive (Addition Amount: % by Weight) | pH | CuO Contaminated Wafer | | Metal Cu Deposited Wafer |
|---|---|---|---|---|---|
| | | | Conc. of Remaining CuO (atom/cm$^2$) | Amount of Particle (Particle/Wafer) | Metal Cu Film Thickness (nm) |
| Example 11 | Ethylenediamine (0.5%) Mercaptoimidazole (Metal corrosion inhibitor: 0.001%) Citric acid (pH adjuster) | 10 | 5 × 10$^{10}$ | 35 | 1000 |
| Example 12 | Ethylenediamine (0.5%) 3-Mercapto-1-propanol (Metal corrosion inhibitor: 0.01%) | 10 | 2 × 10$^{10}$ | 35 | 1000 |
| Comparative Example 1 | No additive | 7 | 3 × 10$^{14}$ | 259 | 1000 |
| Comparative Example 2 | Hydrofluoric Acid (1%) | 1 ↓ | 8 × 10$^{11}$ | 1200 | 150 |
| Comparative Example 3 | Hydrochloric Acid (5%) | 1 ↓ | 5 × 10$^9$ ↓ | 850 | 600 |
| Comparative Example 4 | TMAH (pH adjuster: 0.01%) | 12 ↑ | 3 × 10$^{14}$ | 30 ↓ | 950 |
| Comparative Example 5 | Acetic acid (1%) TMAH (pH adjuster) | 5 | 1 × 10$^{14}$ | 102 | 950 |
| Comparative Example 6 | Acetylacetone (0.01%) Choline (pH adjuster) | 9 | 4 × 10$^{13}$ | 89 | 1000 |

As obvious from Table 4, the cleaning agent of the present invention can effectively remove remaining CuO and particles adsorbed on the surface of a semiconductor on which Cu wiring is provided at the same time without giving an unfavorable influence on said Cu wiring and Cu thin film of said semiconductor.

As described above, it can be seen that the cleaning agent containing the compound in accordance with the present invention is the only cleaning agent that can effectively remove remaining CuO and particles adsorbed on the surface of the semiconductor on which Cu wiring is provided at the same time without giving a harmful influence on said Cu wiring and Cu thin film of said semiconductor.

The invention claimed is:

1. An article of manufacture comprising a cleaning agent in contact with a surface of a semiconductor on which copper wiring is provided, the cleaning agent comprising at least one member selected from the group consisting of a compound shown by the following general formulas [1'], quinaldic acid, aromatic diamines selected from the group consisting of diaminobenzene and diaminonaphthalene, ureas selected from the group consisting of urea and uric acid, thioureas selected from group consisting of thiourea and thiosemicarbazide, and a compound shown by the following general formulas [3], [4] or [5]:

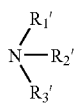
[1']

[wherein, $R_1'$ and $R_2'$ are an alkyl group and $R_3'$ is a hydrogen atom or an alkyl group];

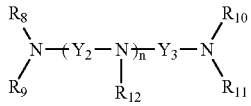
[3]

(wherein, each of $R_8$-$R_{12}$ is independently a hydrogen atom or an alkyl group that may have a hydroxyl group or a phosphonic acid group; each of $Y_2$ and $Y_3$ is independently an alkylene group; and n is an integer of 1 or more);

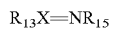   [4]

(wherein, X is =$CR_{14}$ or a nitrogen atom; and each of $R_{13}$-$R_{15}$ is independently a hydrogen atom, a hydrocarbon group that may have a hydroxyl group or a carboxyl group, or a monovalent group derived from a heterocycle having a nitrogen atom as a ring member atom);

   [5]

(wherein, each of $R_{16}$ and $R_{17}$ is independently a monovalent group derived from a heterocycle having a nitrogen atom as a ring member atom),
wherein said at least one member being provided in an amount in contact with a surface of a semiconductor on which copper wiring is provided so as to remove CuO on said surface.

2. An article of manufacture according to claim 1, wherein the cleaning agent comprises diethylenetriamine.

3. An article of manufacture according to claim 1, wherein the cleaning agent comprises 2,2'-dipyridyl or 4,4'-dipyridyl.

4. An article of manufacture according to claim 1, wherein the agent is weakly acidic to alkaline.

5. An article of manufacture according to claim 4, wherein the agent is weakly acidic to alkaline as of pH 5-12.

6. An article of manufacture according to claim 1, wherein the agent further comprises a quaternary amine as a pH adjuster.

7. An article of manufacture according to claim 6, wherein the quaternary amine is tetramethylammonium hydroxide or choline.

8. An article of manufacture according to claim 1, wherein the agent further comprises a carboxylic acid, derivative thereof or salt thereof as a pH adjuster.

9. An article of manufacture according to claim 8, wherein the carboxylic acid, derivative thereof or salt thereof is selected from the group consisting of citric acid, oxalic acid, phthalic acid, tartaric acids, derivatives thereof and salts thereof.

10. An article of manufacture according to claim 1, wherein the agent further comprises a metal corrosion inhibitor.

11. An article of manufacture according to claim 10, wherein the metal corrosion inhibitor is benzotriazole or derivative thereof, thiourea or a thiol compound selected from the group consisting of mercaptothiazole, mercaptoethanol and thioglycerol.

12. An article of manufacture comprising a cleaning agent in contact with a surface of a semiconductor on which copper wiring is provided, the cleaning agent comprising a compound shown by the following general formulas [1'], [2], [3], [4] or [5], said agent is weakly acidic to alkaline:

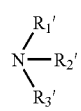
[1']

[wherein, $R_1'$ is an alkyl group that may have a hydroxyl group or a phosphonic acid group, a group shown by the following general formula [6]:

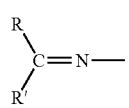
[6]

(wherein, each of R and R' is independently a hydrocarbon group); or
a group shown by the following general formula [7]:

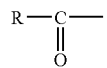
[7]

(wherein R is same as the above); and
each of $R_2'$ and $R_3'$ is independently a hydrogen atom or an alkyl group that may have a hydroxyl group, a carboxyl group or a phosphonic acid group];

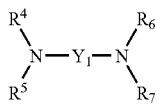

[2]

(wherein, each of $R_4$-$R_7$ is independently a hydrogen atom or an alkyl group that may have a hydroxyl group, a carboxyl group or a phosphonic acid group; and $Y_1$ is a bond, a divalent hydrocarbon group,

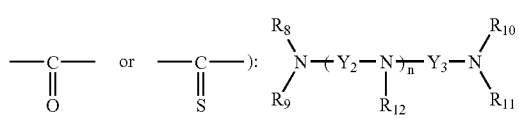

[3]

(wherein, each of $R_8$-$R_{12}$ is independently a hydrogen atom or an alkyl group that may have a hydroxyl group, a carboxyl group or a phosphonic acid group; each of $Y_2$ and $Y_3$ is independently an alkylene group; and n is an integer of 1 or more);

$R_{13}X=NR_{15}$ [4]

(wherein, X is $=CR_{14}$ or a nitrogen atom; and each of $R_{13}$-$R_{15}$ is independently a hydrogen atom or a hydrocarbon group that may have a hydroxyl group or a carboxyl group, or a monovalent group derived from a heterocycle having a nitrogen atom as a ring member atom);

$R_{16}$-$R_{17}$ [5]

(wherein, each of $R_{16}$ and $R_{17}$ is independently a monovalent group derived from a heterocycle having a nitrogen atom as a ring member atom),
wherein said at least one member being provided in an amount in contact with a surface of a semiconductor on which copper wiring is provided so as to remove CuO on said surface.

13. An article of manufacture according to claim 12, wherein the cleaning agent comprises a compound selected from the group consisting of ethylenediamine, ethylenediamine-tetrakis (methylenephosphonic acid) and thiourea.

14. An article of manufacture according to claim 12, wherein the cleaning agent comprises diethylenetriamine or diethylenetriamine-N,N,N',N'',N''-pentaacetate.

15. An article of manufacture according to claim 12, wherein the cleaning agent comprises 2,2'-dipyridyl or 4,4'-dipyridyl.

16. An article of manufacture according to claim 12, wherein the agent is weakly acidic to alkaline as of pH 5-12.

17. An article of manufacture according to claim 12, wherein the agent further comprises a pH adjuster.

18. An article of manufacture according to claim 12, wherein the agent further comprises a metal corrosion inhibitor.

19. An article of manufacture according to claim 17, wherein the pH adjuster is selected from the group consisting of a carboxylic acid, derivative thereof, salt thereof and a quaternary amine.

20. An article of manufacture according to claim 19, wherein the carboxylic acid, derivative thereof or salt thereof is selected from group consisting of citric acid, oxalic acid, phthalic acid, tartaric acid, derivatives thereof and salts thereof.

21. An article of manufacture according to claim 19, wherein the quaternary amine is tetramethylammonium hydroxide or choline.

22. An article of manufacture according to claim 18, wherein the metal corrosion inhibitor is benzotriazole or derivative thereof, thiourea or a thiol compound selected from the group consisting of mercaptothiazole, mercaptoethanol and thioglycerol.

23. An article of manufacture according to claim 17, wherein the agent comprises 0.0001-10% by weight of pH adjuster.

24. An article of manufacture according to claim 18, wherein the agent comprises 0.01-5% by weight of metal corrosion inhibitor.

25. An article of manufacture according to claim 17, wherein the pH adjuster is selected from the group consisting of a carboxylic acid, derivative thereof or salt thereof and a quaternary amine.

26. An article of manufacture according to claim 25, wherein the carboxylic acid, derivative thereof or salt thereof is selected from the group consisting of citric acid, oxalic acid, phthalic acid, tartaric acid, derivatives thereof and salts thereof and the quaternary amines is tetramethylammonium hydroxide or choline.

27. An article of manufacture according to claim 18, wherein the semiconductor on which copper wiring is provided, is one after being subjected to a chemical mechanical polishing process.

28. An article of manufacture comprising a removal agent for copper oxide and particles on a surface of a semiconductor on which copper wiring is provided at the same time, the removal agent being in contact with said surface, the removal agent comprising a compound shown by the following general formulas [1'], [2], [3], [4] or [5], said agent is weakly acidic to alkaline:

[1']

[wherein, $R_1'$ is an alkyl group that may have a hydroxyl group or a phosphonic acid group, a group shown by the following general formula [6]:

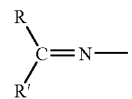

[6]

(wherein, each of R and R' is independently a hydrocarbon group); or
a group shown by the following general formula [7]:

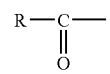

[7]

(wherein R is same as the above); and
each of $R_2'$ and $R_3'$ is independently a hydrogen atom or an alkyl group that may have a hydroxyl group, a carboxyl group or a phosphonic acid group];

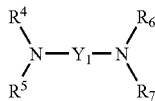
[2]

(wherein, each of $R_4$-$R_7$ is independently a hydrogen atom or an alkyl group that may have a hydroxyl group, a carboxyl group or a phosphonic acid group; and $Y_1$ is a bond, a divalent hydrocarbon group,

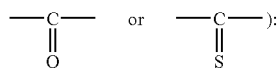

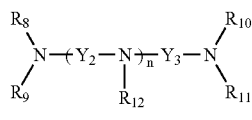
[3]

(wherein, each of $R_8$-$R_{12}$ is independently a hydrogen atom or an alkyl group that may have a hydroxyl group, a carboxyl group or a phosphonic acid group; each of $Y_2$ and $Y_3$ is independently an alkylene group; and n is an integer of 1 or more);

$R_{13}X=NR_{15}$ [4]

(wherein, X is $=CR_{14}$ or a nitrogen atom; and each of $R_{13}$-$R_{15}$ is independently a hydrogen atom or a hydrocarbon group that may have a hydroxyl group or a carboxyl group, or a monovalent group derived from a heterocycle having a nitrogen atom as a ring member atom);

$R_{16}$-$R_{17}$ [5]

(wherein, each of $R_{16}$ and $R_{17}$ is independently a monovalent group derived from a heterocycle having a nitrogen atom as a ring member atom), wherein said at least one member being provided in an amount in contact with a surface of a semiconductor on which copper wiring is provided so as to remove CuO on said surface.

29. An article of manufacture, comprising a cleaning agent in contact with a surface of a semiconductor on which copper wiring is provided, the cleaning agent comprising at least one member selected from the group consisting of a compound shown by the following general formulas [1'], quinaldic acid, aromatic diamines selected from the group consisting of diaminobenzene and diaminonaphthalene, ureas selected from the group consisting of urea and uric acid, thioureas selected from group consisting of thiourea and thiosemicarbazide, and a compound shown by the following general formulas [3]:

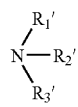
[1']

[wherein, $R_1'$ and $R_2'$ are an alkyl group and $R_3'$ is a hydrogen atom or an alkyl group];

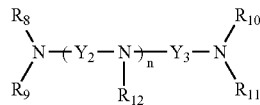

(wherein, each of $R_8$-$R_{12}$ is independently a hydrogen atom or an alkyl group that may have a hydroxyl group or a phosphonic acid group; each of $Y_2$ and $Y_3$ is independently an alkylene group; and n is an integer of 1 or more).

30. An article of manufacture, comprising a cleaning agent in contact with a surface of a semiconductor on which copper wiring is provided, the cleaning agent comprising a compound shown by the following general formulas [1'], [2] or [3], said agent is weakly acidic to alkaline:

[1']

[wherein, $R_1'$ is an alkyl group that may have a hydroxyl group or a phosphonic acid group, a group shown by the following general formula [6]:

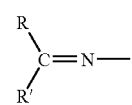
[6]

(wherein, each of R and R' is independently a hydrocarbon group); or a group shown by the following general formula [7]:

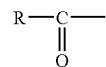
[7]

(wherein R is same as the above); and each of $R_2'$ and $R_3'$ is independently a hydrogen atom or an alkyl group that may have a hydroxyl group, a carboxyl group or a phosphonic acid group];

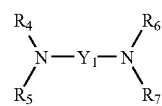
[2]

(wherein, each of $R_4$-$R_7$ is independently a hydrogen atom or an alkyl group that may have a hydroxyl group, a carboxyl group or a phosphonic acid group; and $Y_1$ is a bond, a divalent hydrocarbon group,

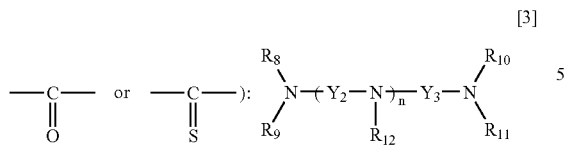
[3]

(wherein, each of $R_8$-$R_{12}$ is independently a hydrogen atom or an alkyl group that may have a hydroxyl group, a carboxyl group or a phosphonic acid group; each of $Y_2$ and $Y_3$ is independently an alkylene group; and n is an integer of 1 or more).

31. An article of manufacture, comprising a removal agent for copper oxide and particles on a surface of a semiconductor on which copper wiring is provided at the same time, the removal agent being in contact with said surface, the removal agent comprising a compound shown by the following general formulas [1'], [2] or [3], said agent is weakly acidic to alkaline:

[1']

[wherein, $R_1'$ is an alkyl group that may have a hydroxyl group or a phosphonic acid group, a group shown by the following general formula [6]:

[6]

(wherein, each of R and R' is independently a hydrocarbon group); or a group shown by the following general formula [7]:

[7]

(wherein R is same as the above); and each of $R_2'$ and $R_3'$ is independently a hydrogen atom or an alkyl group that may have a hydroxyl group or a phosphonic acid group];

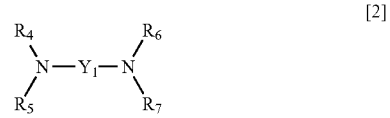
[2]

(wherein, each of $R_4$-$R_7$ is independently a hydrogen atom or an alkyl group that may have a hydroxyl group, a carboxyl group or a phosphonic acid group; and $Y_1$ is a bond, a divalent hydrocarbon group,

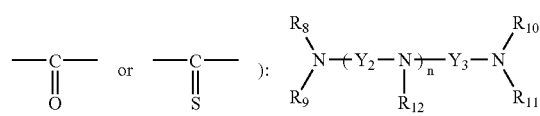
[3]

(wherein, each of $R_8$-$R_{12}$ is independently a hydrogen atom or an alkyl group that may have a hydroxyl group, a carboxyl group or a phosphonic acid group; each of $Y_2$ and $Y_3$ is independently an alkylene group; and n is an integer of 1 or more).

* * * * *